United States Patent [19]
DiBattista et al.

[11] Patent Number: 5,731,587
[45] Date of Patent: Mar. 24, 1998

US005731587A

[54] HOT STAGE FOR SCANNING PROBE MICROSCOPE

[75] Inventors: Michael DiBattista; Sanjay V. Patel, both of Ann Arbor; John L. Gland, Pickney; Johannes W. Schwank, Ann Arbor, all of Mich.

[73] Assignee: The Regents Of The University Of Michigan, Ann Arbor, Mich.

[21] Appl. No.: 695,799

[22] Filed: Aug. 12, 1996

[51] Int. Cl.$^6$ ............................................. G21K 5/08
[52] U.S. Cl. ............................................. 250/443.1
[58] Field of Search ........................ 250/443.1, 440.1, 250/306, 307, 310, 311

[56] References Cited

U.S. PATENT DOCUMENTS

| | | | |
|---|---|---|---|
| 4,953,387 | 9/1990 | Johnson et al. | 73/25.03 |
| 5,262,127 | 11/1993 | Wise et al. | 422/98 |
| 5,296,255 | 3/1994 | Gland et al. | 427/8 |
| 5,385,709 | 1/1995 | Wise et al. | 422/98 |
| 5,440,122 | 8/1995 | Yasutake | 250/443.1 |
| 5,464,966 | 11/1995 | Gaitan et al. | 219/544 |

OTHER PUBLICATIONS

*Shrinkage of Glass Soot Samples using Hot–Stage Scanning Electron Microscopy,* Dipak R. Biswas, Communications of the American Ceramic Society, Jul. 1984, C–140–C–141.

*Microstructural measurements of amorphous GeTe crystallization by hot–stage Optical microscopy,* Q.M. Lu and M. Libera, J. Appl. Phys. 77(2), 15 Jan. 1995, 1995 American Institute of Physics, pp. 517–521.

*Optical Hot Stage Microscopy for Brazing Investigations,* K. Aa. Thorsen, H. Fordsmand, and P.L. Praestgaard, Welding Research Supplment, Nov. 1994, 339–s–344–s.

*Hot–stage for in situ operation of a battery in a scanning electron microscope,* R.N. Singh, R.H. Ettinger, and N. Lewis, 1984 American Institute of Physics, Rev. Sci. Instrum. 55(5), May 1984, pp. 773–777.

*Hot stage and sample cell design for the solidification of transparent materials with and without forced convention,* William F. Kaukler, 1984 American Institute of Physics, Rev. Sci Instrum. 55(10), Oct. 1984, pp. 1643–1647.

*Real–time hot–stage high–voltage transmission electron microscopy precipitation of CDs nanocrystals in glasses: Experiment and theoretical analysis,* Li–Chi Liu and S.H. Risbud, J. Appl. Phys. 76(8), Oct. 1994, pp. 4576–4580.

*Design of a Hot Tensile Stage for an Ultra–High–Voltage Electron Microscope and its Applications to in situ Deformation of Sapphire at 1620 and 1720 K,* M. Komatsu, H. Mori, K. Iwasaki, J. Am. Ceram. Soc. 77(3) 839–842 (1994).

*Primary Examiner*—Kiet T. Nguyen
*Attorney, Agent, or Firm*—Harness, Dickey & Pierce, PLC

[57] ABSTRACT

A hot stage for a scanning probe microscope includes a substrate having a dielectric window region which is stress compensated to be held in mild tension at elevated temperatures. A heating element is supplied to heat a specimen deposited on the dielectric widow region and the scanning probe microscope is used to observe specimen characteristics at the elevated temperatures. The dielectric window region is configured to be thermally isolated from the rest of the hot stage allowing only a minimum amount of heat to be dissipated into the scanning probe microscope. Temperature sensing resistors are included for monitoring the temperature in the dielectric window region. Conductivity cell electrodes can also be included for sensing the conductivity and capacitance of the specimen. Furthermore, additional control and measurement hardware, such as a temperature sensor circuit, evaluation station, the ramp generator circuit, etc. can be included to provide additional system features.

20 Claims, 8 Drawing Sheets

HOT STAGE FOR SCANNING PROBE MICROSCOPE

BACKGROUND OF THE INVENTION

1. Field of the Invention

The present invention relates to hot stages for use with microscopes. More particularly, the present invention relates to microfabricated hot stages for use with scanning probe microscopes.

2. Background Information

Scanning probe microscopy techniques, such as scanning tunneling, atomic force, and related techniques, allow the imaging of specimen surfaces at angstrom scale vertical and lateral resolution. These techniques work in a diverse number of environments. Typically, specimens are strongly influenced by many factors, making it difficult to determine the exact relationship between the specimen structure and the chemical and physical properties of the material. In-situ investigations at elevated temperatures using scanning probe microscopes provides the opportunity for real time observation of specimen changes under controlled conditions.

Hot stages can be used to provide the controlled temperature conditions. Hot stages have been developed which for use with light and/or electron microscopes. However, hot stages designed for use with light and/or electron microscopes are too big to be used in scanning probe microscopes. Furthermore, currently available hot stages release a high amount of heat which could cause thermal convection and conductive heat transfer, possibly interfering with the proper operation of scanning probe microscopes and damaging delicate parts of the microscopes.

Thus, there is a need for a hot stage suitable for use with a scanning probe microscope which can be used to provide controlled temperature conditions for in-situ specimen investigation while still protecting the microscope from damage due to excessive heat.

SUMMARY OF THE INVENTION

The present invention provides a hot stage adapted for use with a scanning probe microscope to enable in-situ investigations of specimens under conditions closely resembling "real" processes and high temperature environments. The hot stage enables examination of the surface condition and morphology of a wide variety of specimens from, among others, biological, polymeric, ceramic and metallurgical fields. The invention can be retrofitted into existing scanning probe microscopes to expand the microscopes capabilities to include temperature programmed, high temperature analysis of the specimen. The hot stage/scanning probe microscope combination enables the direct observation of changes in structure and/or composition of a specimen caused by exposure of the specimen to different environments under controlled temperature conditions.

The hot stage of the present invention includes a substrate and a small dielectric window region which is thermally isolated from the rest of the hot stage structure. A heating element heats the specimen in the dielectric window region releasing only an insignificant amount of heat into the microscope. The heating element is controlled by a temperature controller which is programmed to raise and maintain the heating element temperature in a controlled manner.

The hot stage is supported by a rim ring structure which acts to minimize vibration of the specimen. A printed circuit board having leads for connecting the temperature controller to the heating element is connected to the hot stage and attached to a specimen puck, which is used to mount the hot stage in the microscope. The structure of the hot stage of the present invention enables use of the hot stage with a variety of scanning methods including contact, non-contact, intermittent contact, etc.

One important aspect of the dielectric window region is that it is stress compensated to minimize deflection of the substrate at elevated temperatures. Without stress compensation, substrate region would buckle and possibly shatter as the temperature was raised. However, due to the stress compensation, the substrate region remains smooth and flat at elevated temperatures. This is particularly important in scanning probe microscope applications since the probe of the scanning probe microscope is rastered across the specimen surface measuring the interaction between the specimen and the tip of the probe.

Further objects, features and advantages of the invention will become apparent from a consideration of the following description and the appended claims when taken in connection with the accompanying drawings.

DETAILED DESCRIPTION OF THE PREFERRED EMBODIMENT

Preferred embodiments of the hot stage for use with a scanning probe microscope are described herebelow with reference to the drawings.

Figure 1:
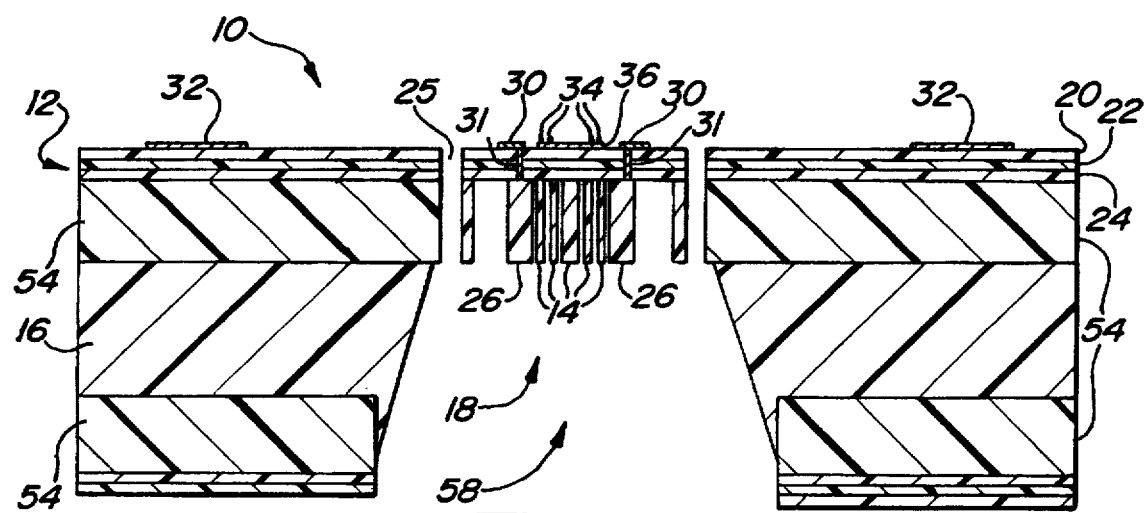
FIG. 1 is a cross-sectional view of the hot stage of the present invention.
Figure 2:
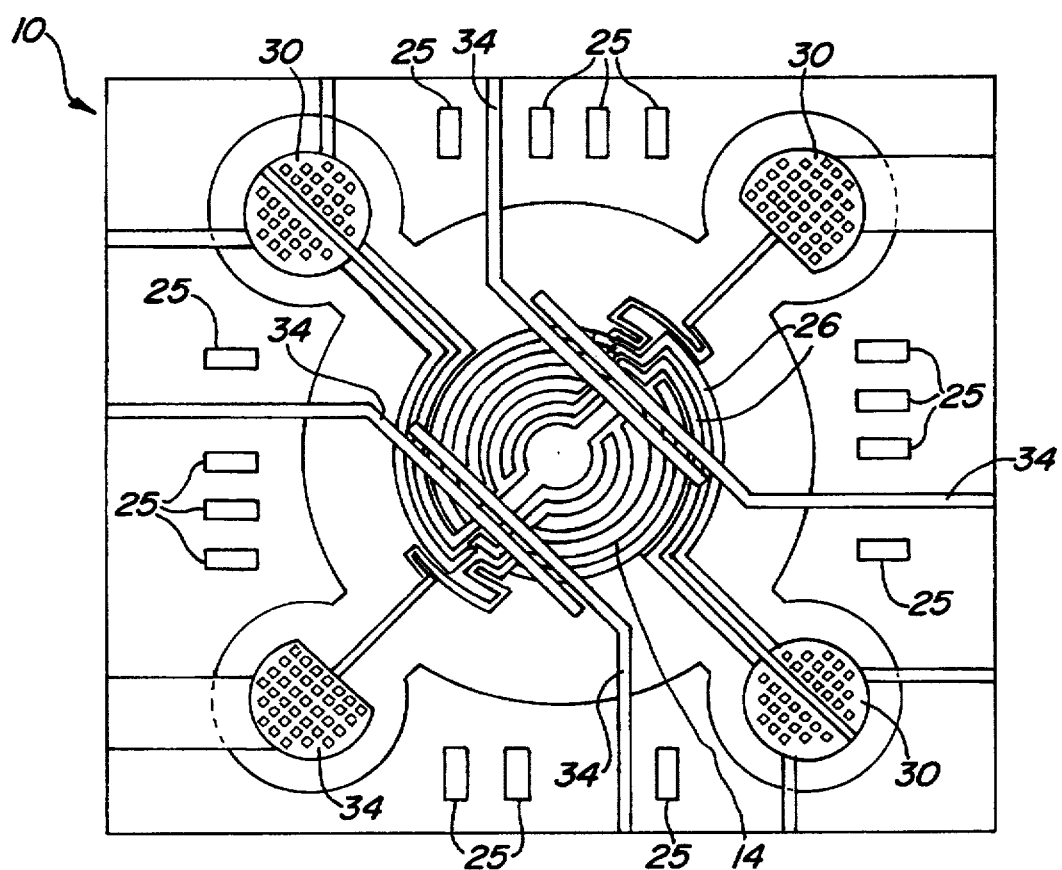
FIG. 2 is a top view of the hot stage of FIG. 1.
Figure 3:
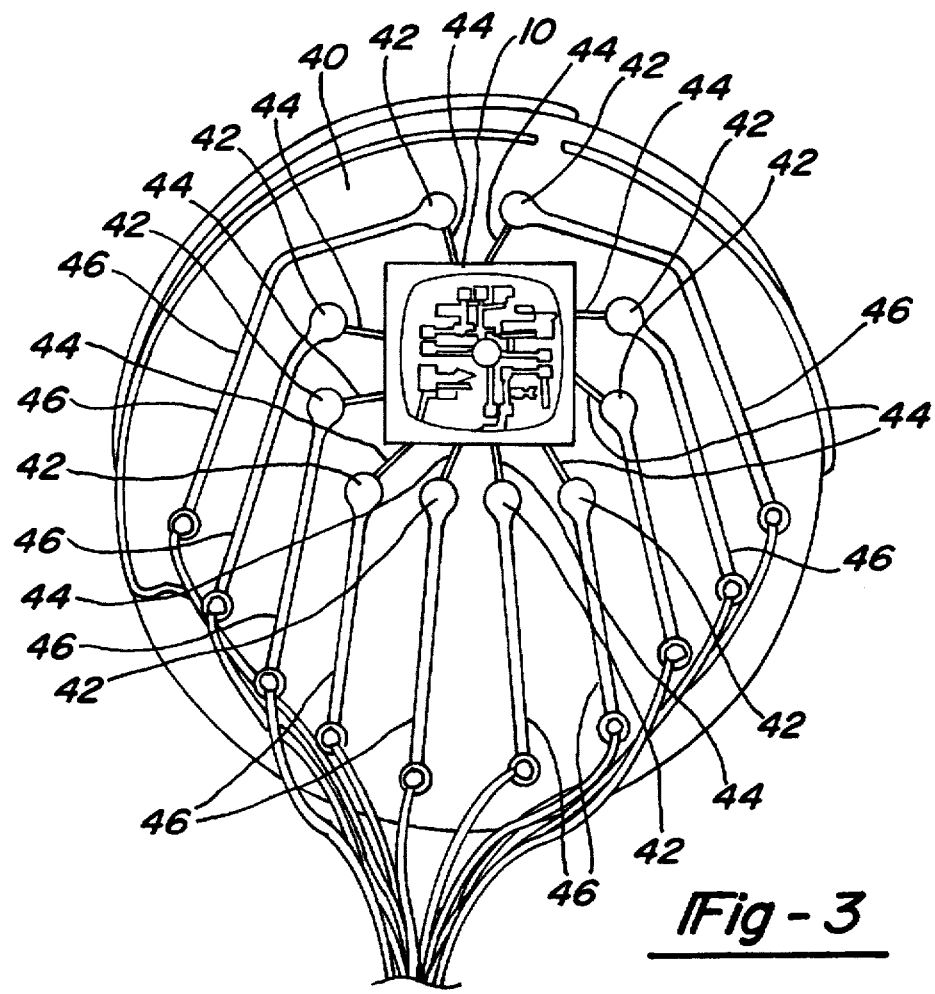
FIG. 3 is an enlarged top view of the hot stage of FIG. 1, mounted onto a printed circuit board according to the present invention.
Figure 4:
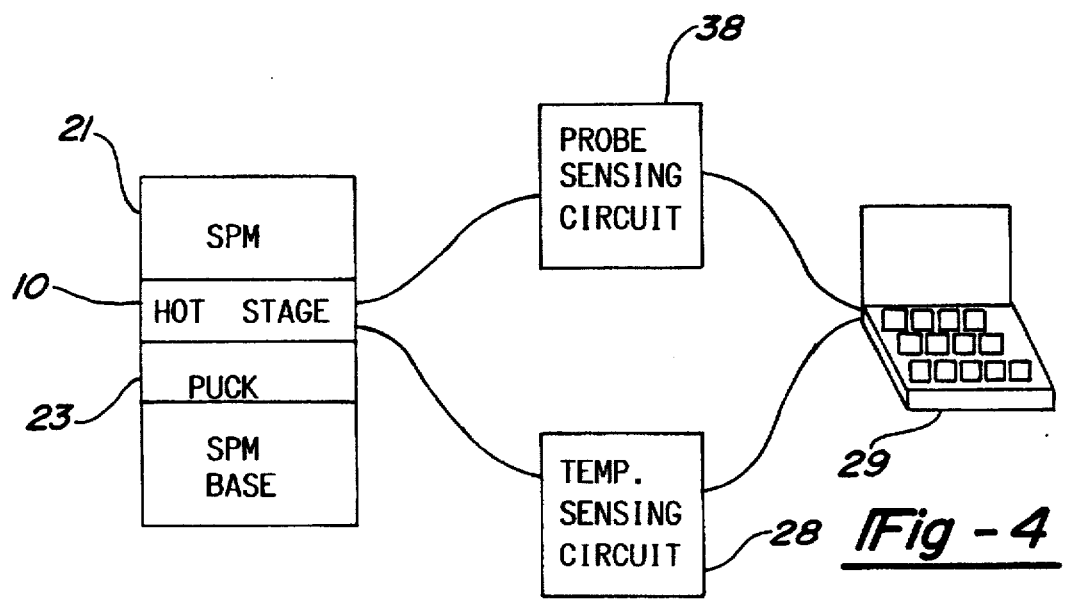
FIG. 4 is a schematic diagram of the hot stage and associated peripheral equipment according to the present invention.

Referring now to FIGS. 1–4, the hot stage, generally designated 10, includes a substrate 12, a heating element 14, a micromachined dielectric window region 18 and a rim support structure 16. The substrate 12 is comprised of a top layer of silicon oxide 20, a middle layer of silicon nitride 22 and a bottom layer of silicon oxide 24. The present invention can be retrofitted onto an existing scanning probe microscope 21 to expand the microscope's current capabilities to include high temperature analysis of a specimen.

Layers 20, 22 and 24 are configured to provide stress compensation for dielectric window region 18 at elevated temperatures. Layers 20 and 24, made from silicon oxide, contain inherent compressive forces and layer 22, made from silicon nitride, contains inherent tensile forces. By "sandwiching" layer 22 between layers 20 and 24, the compressive and tensile forces inherent in layers 20, 22 and 24 somewhat offset each other holding dielectric window region 18 smooth and flat. Furthermore, by properly selecting layer thickness, dielectric window region 18 is configured to be held in compression at room temperature. In the preferred embodiment, layer 20 is 4000 angstroms thick, layer 22 is 5000 angstroms thick and layer 24 is 3000 angstroms thick. Layer thickness and/or additional layers may be added to increase dielectric window region 18 thickness and strength.

As heating element 14 heats dielectric window region 18 to elevated temperatures, dielectric window region 18 expands to a condition of mild tension at the elevated temperatures. At mild tension at the elevated temperatures, dielectric window region 18 is held taut ensuring a smooth flat surface. Without stress compensation, dielectric window region 18 is likely to crack or shatter at the elevated temperatures or buckle making viewing with scanning probe microscope 21 virtually impossible. Stress compensation prevents cracking and shattering and promotes the longevity of hot stage 10. Dielectric window region 18 provides a high degree of thermal isolation between the heated area and rim support structure 16. The heated region of the device is approximately 350 nm in diameter. This design allows heating element 14 to operate at elevated temperatures while rim support structure 16 remains near room temperature. Furthermore, the low thermal mass of dielectric window region 18 allows for low power consumption and rapid temperature response.

Hot stage 10 further includes a temperature controller. In the preferred embodiment, the temperature controller includes temperature sensing resistors 26 for sensing the temperature in dielectric window region 18 and temperature sensor circuit 28 for controlling heating element 14. Temperature sensing circuit 28 is configured to respond to user input and to a sensed temperature signal generated by temperature sensing resistors 26. In the preferred embodiment, two temperature sensing resistors 26 are used. The preferred temperature sensor circuit 28 comprises a temperature measurement circuit 33, a ramp generator circuit 37, and a constant current heater controller circuit 35. The temperature measurement circuit 33 is configured to receive and report the sensed temperature from sensed temperature signals generated by temperature sensing resistors 26 and automatically control the current supplied to heating element 14. The constant current heater controller circuit 35 is configured to manually control the current supplied to heating element 14. The ramp generator circuit 37 is configured to receive user input and vary the current supplied to heating element 14 to ramp the temperature in the dielectric window region 18 between an initial and final temperature.

Temperature sensor circuit 28 is configured to communicate with an evaluation station 29, such as a personal computer. The hot stage/scanning probe microscope system can be calibrated at room temperature using evaluation station 29. User inputs can be entered into evaluation station 29 through specially designed control software. Sensed temperature signals, generated by temperature sensing resistors 26 and conditioned by the temperature measurement circuit 33, are received by evaluation station 29. Evaluation station 29 evaluates the sensed temperature signals and signals temperature adjustments to the temperature measurement circuit 33 which in turn adjusts the amount of current supplied to heating element 14.

Contact pads 30 are included and are connected to heating element 14 and temperature sensing resistors 26 by conduction leads 31 extending through layers 20, 22 and 24.

Contact pads 30 are electrically connected to remote bonding pads 32 which in turn are connected to external electrical components such as temperature sensing circuit 28 to provide electrical connections between heating element 14 and temperature sensing resistors 26 and temperature sensing circuit 28.

Conductivity cell electrodes 34 can be included for sensing the conductivity and capacitance of the specimen. The conductivity cell electrodes 34 are electrically connected to a four point probe sensor circuit 38 which receives and conditions conductivity cell electrode signals. The preferred embodiment includes four conductivity cell electrodes 34.

The hot stage 10 is mounted on a printed circuit board 40 which, in the preferred embodiment, is 15 mm in diameter. Patterned leads 42 and an area for hot stage 10 are patterned on printed circuit board 40 using standard gold or copper screen printing techniques. Hot stage 10 is attached to printed circuit board 40 and after curing, hot stage 10 is wire bonded, using gold, aluminum or Pt wire 44, to make electrical contact from bonding pads 32 to patterned leads 42 on printed circuit board 40. Additional wires 46 are soldered to patterned leads 42 in order to enable electrical contact with control and measurement hardware such as temperature sensor circuit 28, evaluation station 29, four point probe sensor circuit 38, etc. The preferred embodiment includes ten bonding pads 32 connected to ten patterned leads 42, two for connecting heating element 14, four for connecting the two temperature sensing resistors 26 (two leads per temperature sensing resistor), and four for connecting for the four conductivity cell electrodes 34 (one lead per conductivity cell electrode). Printed circuit board 40 allows electrical interface with hot stage 10 to provide power to heating element 14 and to measure hot stage 10 temperature. With this invention, topographical images and four point probe resistance measurements can be acquired without image distortion due to thermal effects.

Hot stage 10 mounted on printed circuit board 40 is attached to a microscope specimen puck 23 with a double sided adhesive layer. Specimen puck 23 is used to mount hot stage 10 in the scanning probe microscope. Generally, specimen puck 23 is magnetized and holds hot stage 10 in place in scanning probe microscope 21 with magnetic forces. The small size and device packaging allows hot stage 10 to be retrofitted into commercial microscopes. These features allow hot stage 10 to operate at temperatures up to 800° C. without damaging scanning probe microscope 21 due to the thermal isolation.

Figure 5A:
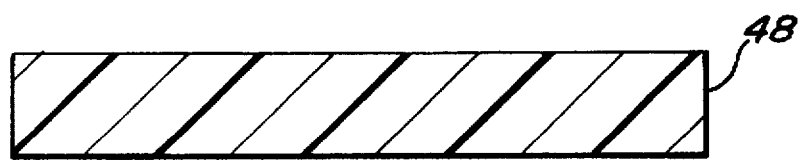
FIGS. 5a–5j are cross sectional views illustrating the fabrication process of the present invention.
Figure 5B:
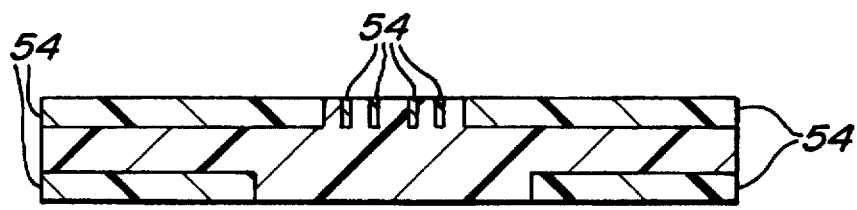
Figure 5C:
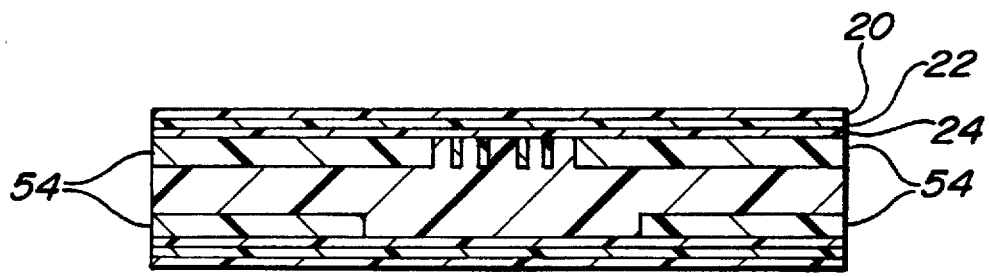
Figure 5D:
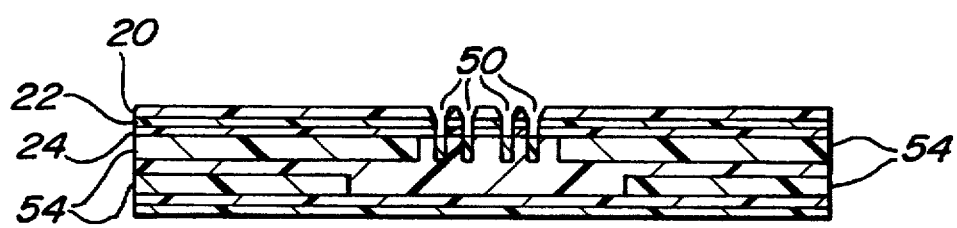
Figure 5E:
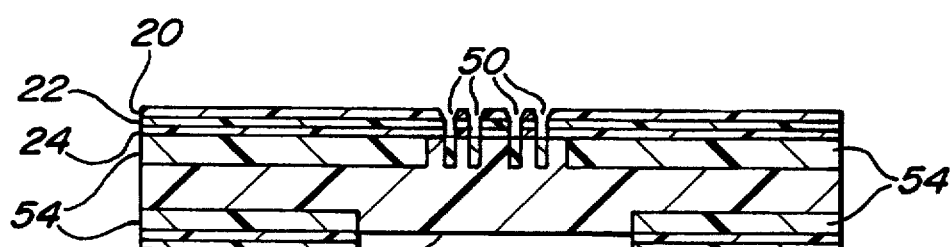
Figure 5F:
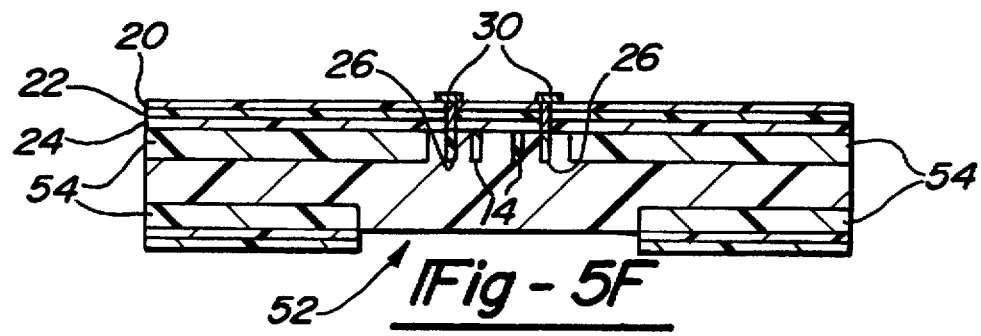
Figure 5G:
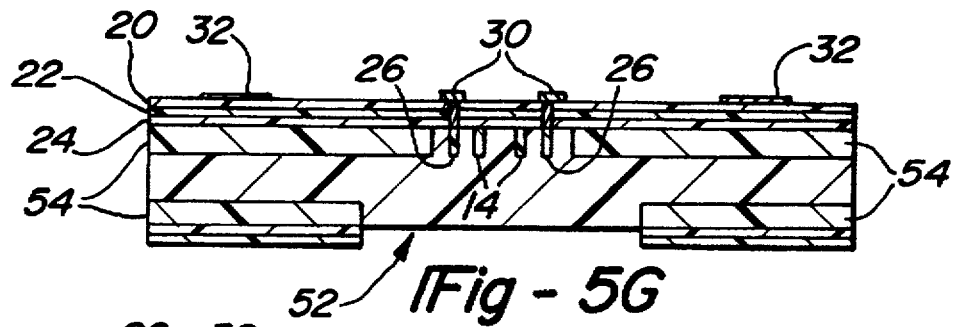
Figure 5H:
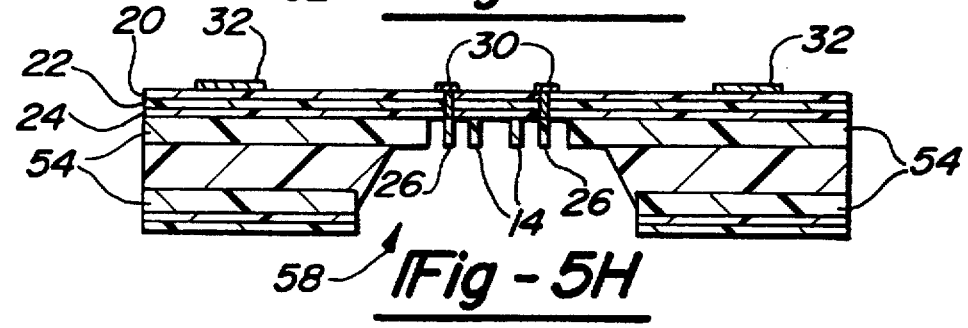
Figure 5I:
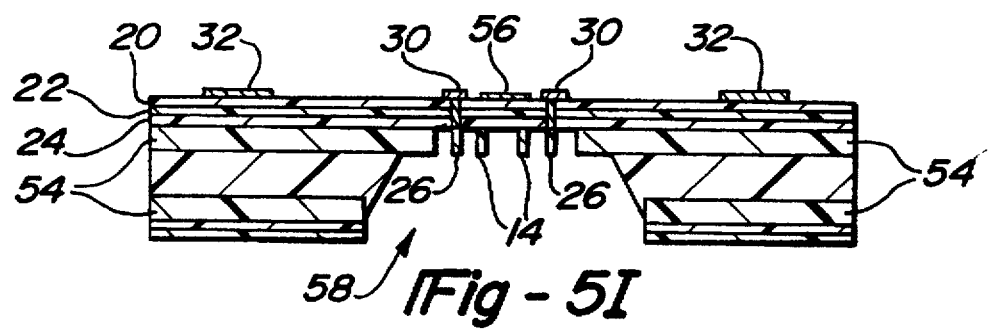
Figure 5J:
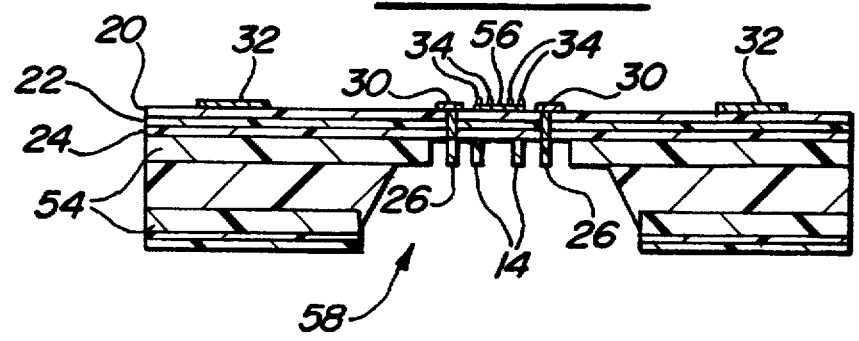
Figure 6:
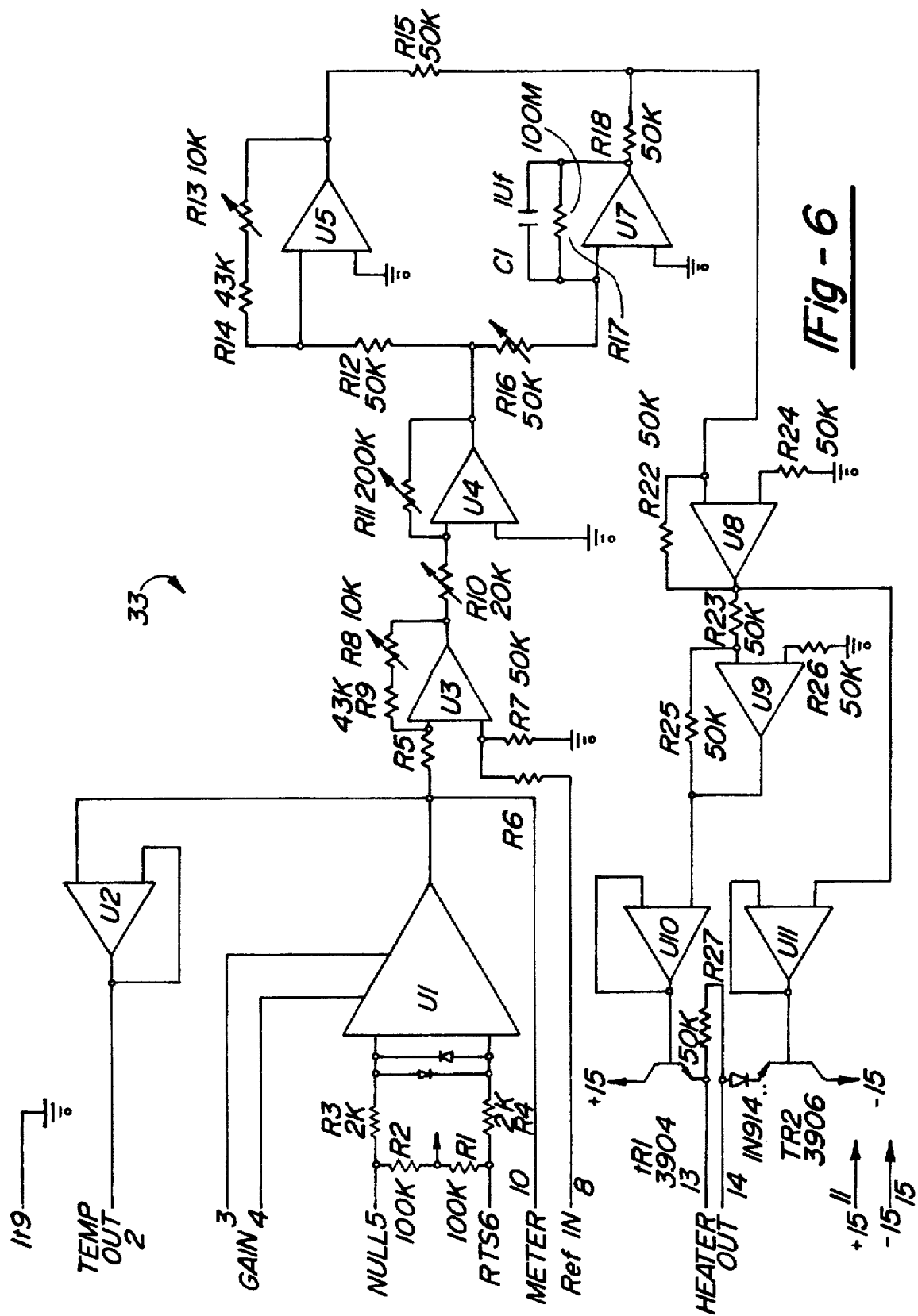
FIG. 6 is a schematic diagram of the temperature measurement circuit of the present invention.
Figure 7:
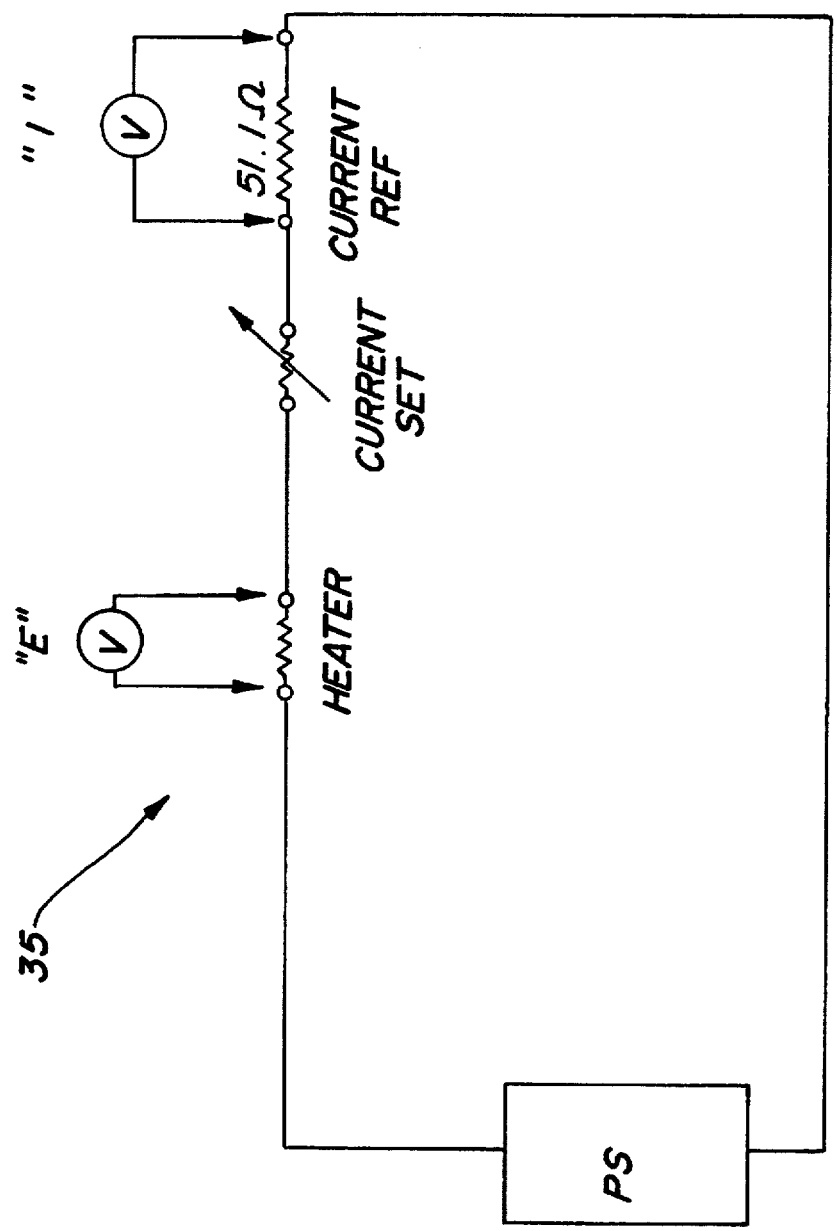
FIG. 7 is a schematic diagram of the constant current heater controller circuit of the present invention.
Figure 8:
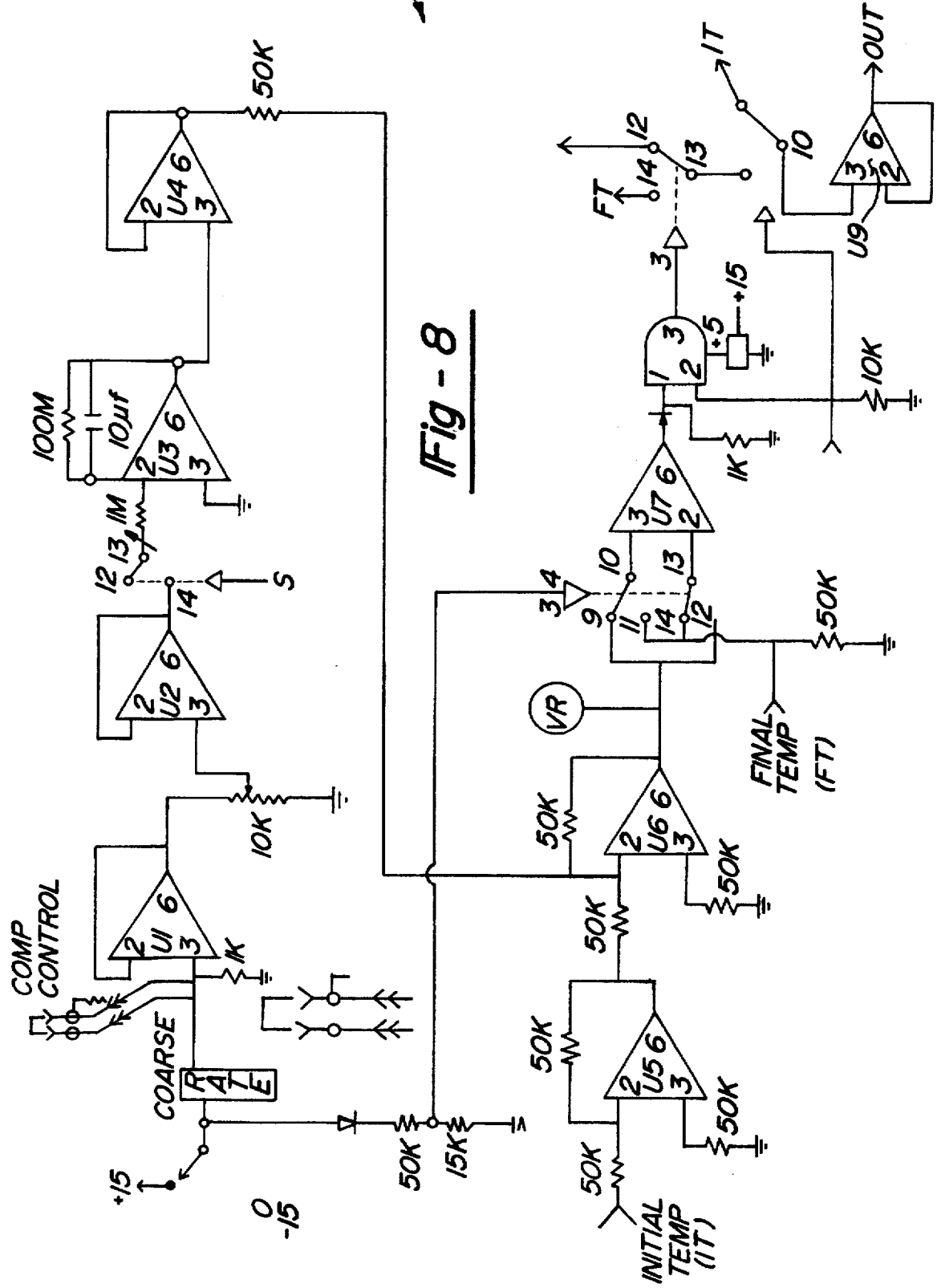
FIG. 8 is a schematic diagram of the ramp generator circuit of the present invention.
Figure 9:
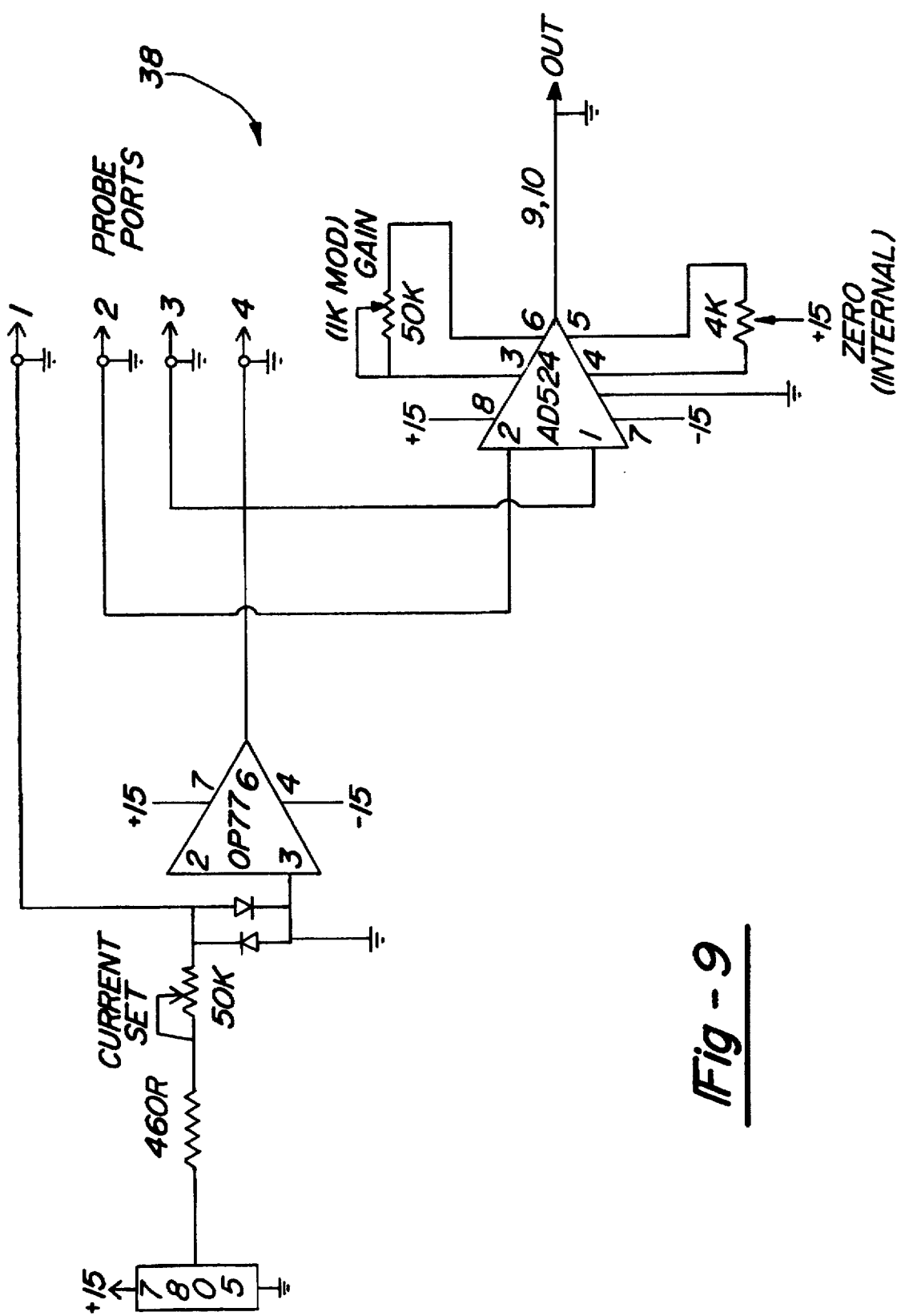
FIG. 9 is a schematic diagram of the four point probe sensor circuit of the present invention.

FIGS. 5a–5j illustrate the fabrication process of hot stage 10. The first step in the process of making hot stage 10 involves micromachining a silicon wafer 48. Silicon wafer 48 is patterned with photolithography on both sides to define boron diffusion regions 54 that will define the size of dielectric window 18, heating element 14, and temperature sensing resistors 26. Diffusion is followed by thermal oxidation and chemical vapor deposition of silicon nitride and silicon oxide to form layers 20, 22 and 24.

Contact openings 50 are formed in layers 20, 22 and 24 by reactive ion etching reaching heating element 14 and temperature sensing resistors 26. Reactive ion etching is also used to etch a window opening 52 through silicon nitride and silicon oxide layers formed on the back side of silicon wafer 48. Contacts to heating element 14 are formed by deposition of chromium and gold. A second layer of chromium/gold is deposited to contact pads 30. Additional bonding pads 32 are formed by further chromium/gold deposits.

Using boron-doped regions 54 as the etch stop, the remaining silicon from silicon wafer 48 is removed during an anisotropic ethylenediamine pyrocatechol etch that separates heating element 14 and temperature sensing resistors 26 from each other and defines the rim of dielectric window region 18. The anisotropic ethylenediamine pyrocatechol etch, produces heater ventilation area 58 which facilitates heat dissipation from heating element 14 thus protecting scanning probe microscope 21 from heat damage. The preferred embodiment of the present invention is capable of temperature control from ambient room temperature up to 800° C. without damage to scanning probe microscope 21.

For certain applications such as investigations involving the properties of titanium and platinum thin films, it may be desirable to sequentially deposit the titanium and platinum film layers 56 over the center of dielectric window region 18. Conductivity cell electrodes 34 can be deposited on top of titanium and platinum film layers 56 to allow film resistance measurements. A method for making hot stage 10 is described in U.S. Pat. No. 4,953,387, issued to Johnson et al., which is incorporated herein by reference.

Additionally, vent holes 25 can be added to substrate 12 in the vicinity of dielectric window region 18 to enable use in specialized environments. For example, in vacuum environments atmosphere may become trapped in heater ventilation area 58 when hot stage 10 is mounted on printed circuit board 40. Vent holes 25 allows air to flow out of heater ventilation area 58 thus equalizing the pressures and preventing damage to hot stage 10. Hot stage 10 is of an ideal size to be placed within an environmentally controlled chamber to expand the ability of scanning probe microscopes to include varied chemical and thermal environments.

In operation, a specimen is placed on the top side of dielectric window region 18 through one of many methods. For example, biological specimens and polymers are typically applied using a micro-pipette or immersion techniques while metals, ceramics and semiconductors are typically deposited using chemical or physical vapor deposition.

Next, hot stage 10 and scanning probe microscope 21 hardware are connected. The setup of every brand of scanning probe microscope 21 is different depending on the functions to be performed, the scanning range and the type of probes used. Setup can vary from connecting the optical head to the base and stage (both electrically and physically) then inserting the probe, to simply placing the stage and specimen under the probe.

The fully functional hot stage device of the preferred embodiment with conductivity cell electrodes 34 and temperature sensing resistors 26 has ten leads to be connected electrically to the control system. The fully functional control system has four electronic circuits including: four point probe circuit 38, the temperature measurement circuit 33, the ramp generator circuit 37 and the constant current heater controller circuit 35.

For isothermal temperature control operated by evaluation station 29, the temperature measurement circuit 33 is connected to hot stage 10. The temperature measurement circuit 33 is used for monitoring temperature sensing resistors 26 and controlling the current supplied to heating element 14 in response to user inputs from evaluation station 29 and sensed temperature signals generated by temperature sensing resistors 26.

For manual isothermal temperature control, the temperature measurement circuit 33 and the constant current heater controller circuit 35 are connected to hot stage 10. The temperature measurement circuit 33 is used for monitoring temperature sensing resistors 26 and displaying the sensed temperature. The constant current heater controller circuit 35 is used for supplying a constant current to heating element 14. The user controls the amount of current supplied by the constant current heater controller circuit 35 by adjusting a manual control.

For computer generated temperature controlled ramps, the temperature measurement circuit 33 and the ramp generator circuit 37 are connected to hot stage 10. The temperature measurement circuit 33 is used for monitoring temperature sensing resistors 26 and controlling the current supplied to heating element 14. The ramp generator circuit 37 is connected to the temperature measurement circuit 33 and supplies the temperature measurement circuit 33 with a varying input beginning at an initial temperature and ending at a final temperature. The initial and final temperatures are entered into evaluation station 29 by the user.

In all situations, four point probe sensor circuit 38 can be connected to hot stage 10 for measuring the electrical properties of the specimen. Four point probe sensor circuit 38 is a stand alone circuit and needs to be connected electrically to the conductivity cell electrode leads and to evaluation station 29.

As indicated above, the temperature measurement circuit 33 can be used for two purposes: temperature measurement or temperature measurement and control. The temperature measurement circuit 33 is a two part circuit that can measure the temperature sensing resistors' resistance, and send those values (in a conditioned form) to evaluation station 29, and control the current supplied to heating element 14 to heat the dielectric window region 18 to a given setpoint. To use temperature measurement only, the temperature sensing resistors 26 are connected to the temperature measurement circuit 33 and the output of the temperature measurement circuit 33 is connected to evaluation station 29. To use temperature measurement and control, heating element 14 and an evaluation station output are also connected to the temperature measurement circuit 33.

To manually control temperature, the temperature measurement circuit 33 is setup in measurement mode only and the constant current heater controller circuit 35 is connected to heating element 14. A dial on the constant current heater controller circuit 35 is used for adjusting a potentiometer value thus controlling the amount of current sent to heating element 14.

To use the temperature ramp function, the temperature measurement circuit 33 is connected in measurement and control mode receiving an input from the ramp generator circuit 37 instead of evaluation station 29. The ramp generator circuit 37 is connected to evaluation station 29 and receives setpoints for the initial and final temperature values from evaluation station 29 through user input.

After scanning probe microscope 21 and hot stage 10 are set up, hot stage 10 is placed into scanning probe microscope 21. Hot stage 10 is meant to be an addition or replacement for the normal puck or stage mount used in scanning probe microscope 21. If scanning probe microscope 21 uses a magnetic stage, the normal procedure is to attach printed circuit board 40 of hot stage 10 onto a stainless steel puck with double sided tape. Once hot stage 10 is on puck 23, the assembly is placed on the magnetic specimen stage in scanning probe microscope 21.

With hot stage 10 mounted in scanning probe microscope 21, the software setup for scanning probe microscope 21 and hot stage 10 is conducted. Typically, before imaging can begin, hot stage 10 must be calibrated and scanning probe microscope 21 settings must be selected. Typical microscope settings include: operation mode (contact, non-contact, or intermittent contact), scan size, scan rate, gains (proportional and integral), and z range. Typical hot stage calibration inputs include: room temperature value of temperature sensing resistors' resistance, temperature range of operation, room temperature, scan rate, gain (for resistance measurement only), and isothermal or temperature programmed ramp mode selection.

Finally, the experiment can be run and data can be collected. Data from hot stage 10 is typically in the form of time, temperature, and resistance readings at a chosen rate. Evaluation station 29 can be used to storing and analyzing the data.

It is to be understood that the invention is not limited to the exact construction illustrated and described above, but that various changes and modifications may be made without departing from the spirit and scope of the invention as defined in the following claims.

We claim:

1. A microfabricated hot stage for use with a scanning probe microscope for analyzing a specimen at a room temperature to elevated temperatures, the hot stage comprising:

a substrate having first and second sides;

a dielectric window region located at said first side of said substrate;

heater means for heating the specimen, said heater means situated on said first side of said substrate and the specimen situated on said second side of said substrate;

temperature controller means for controlling the temperature in said dielectric window region through controlling said heater means;

support means for supporting said substrate, said support means being thermally isolated from said heater means by said dielectric window region, said support means further configured to minimize vibration of the specimen; and mounting means for mounting said hot stage in said scanning probe microscope;

wherein said dielectric window region is stress compensated to minimize deflection of said substrate at the elevated temperatures, ensuring that said second side of said substrate be smooth and flat at the elevated temperatures.

2. The hot stage of claim 1 further comprising:

conductivity cell electrode means situated on said second side of said substrate, wherein said conductivity cell electrode means contacts the specimen and said conductivity cell electrode means senses the electrical properties of the specimen.

3. The hot stage of claim 2 further comprises a four point probe sensor circuit for generating a conductivity signal based on said sensed electrical properties.

4. The hot stage of claim 1 wherein said substrate further includes vent holes for balancing pressure thereby making said hot stage suitable for operation under controlled atmospheres.

5. The hot stage of claim 1 wherein said substrate further comprises:

first, second and third substrate layers, said first substrate layer being comprised of silicon oxide, said second substrate layer being comprised of silicon nitride and said third substrate layer being comprised of silicon oxide wherein said second layer is situated between said first and said third layers.

6. The hot stage of claim 5 wherein each of said first, second and third substrate layers has a thickness and said first substrate layer thickness is approximately 80% of said second substrate layer thickness and said third substrate layer thickness is approximately 60% of said second substrate layer thickness.

7. The hot stage of claim 5 wherein said first substrate layer is approximately 4000 angstroms thick, said second substrate layer is approximately 5000 angstroms thick and said third substrate layer is approximately 3000 angstroms thick.

8. The hot stage of claim 1 wherein said temperature controller means comprises:

a temperature sensing resistor for sensing the temperature in said dielectric window region and for generating a temperature signal indicative of said sensed temperature; and a temperature sensor circuit for receiving said temperature signal and controlling said heater means based on said sensed temperature and a desired temperature.

9. The hot stage of claim 1 wherein said support means further comprises a rim ring structure surrounding said dielectric window region.

10. The hot stage of claim 1 wherein said mounting means further comprises:

a printed circuit board including leads for connecting said temperature controller means to said heater means; and a specimen puck, operably connected to said printed circuit board for holding said hot stage in place in the scanning probe microscope.

11. A system for analyzing in-situ investigations of a specimen at elevated temperatures, said system comprising:

a scanning probe microscope;

a hot stage including heater means for heating the specimen, temperature controller means for controlling said heater means, a substrate, support means for supporting said substrate and a dielectric window region; and mounting means for mounting said hot stage in said scanning probe microscope;

wherein said dielectric window region is stress compensated to minimize deflection of said substrate at the elevated temperatures;

wherein the specimen is heated in said substrate and said support means is thermally isolated from said heater means by said dielectric window region; and wherein said support means is further configured to minimize vibration of said specimen.

12. The system of claim 11 further comprising:

conductivity cell electrode means situated on said substrate, wherein said conductivity cell electrode means contacts the specimen and said conductivity cell electrode means senses the electrical properties of the specimen.

13. The system of claim 12 further comprising:

a four point probe sensor circuit for generating a conductivity signal based on said sensed electrical properties.

14. The system of claim 11 wherein said substrate further includes vent holes for balancing pressure thereby making said hot stage suitable for operation under controlled atmospheres.

15. The system of claim 11 wherein said substrate further comprises:

first, second and third substrate layers, said first substrate layer being comprised of silicon oxide, said second substrate layer being comprised of silicon nitride and said third substrate layer being comprised of silicon oxide wherein said second layer is situated between said first and said third layers.

16. The system of claim 15 wherein each of said first, second and third substrate layers has a thickness and said first substrate layer thickness is approximately 80% of said second substrate layer thickness and said third substrate layer thickness is approximately 60% of said second substrate layer thickness.

17. The system of claim 15 wherein said first substrate layer is approximately 4000 angstroms thick, said second substrate layer is approximately 5000 angstroms thick and said third substrate layer is approximately 3000 angstroms thick.

18. The system of claim 11 wherein said temperature controller means comprises:

a temperature sensing resistor for sensing the temperature in said dielectric window region and for generating a temperature signal indicative of said sensed temperature; and a temperature sensor circuit for receiving said temperature signal and controlling said heater means based on said sensed temperature and a desired temperature.

19. The system of claim 11 wherein said support means further comprises a rim ring structure surrounding said dielectric window region.

20. The system of claim 11 wherein said mounting means further comprises:

a printed circuit board including leads for connecting said temperature controller means to said heater means; and a specimen puck, operably connected to said printed circuit board for holding said hot stage in place in the scanning probe microscope.

* * * * *